(12) United States Patent
Szöcs et al.

(10) Patent No.: US 10,404,214 B2
(45) Date of Patent: Sep. 3, 2019

(54) TECHNIQUES FOR PRODUCING QUANTUM AMPLIFIERS AND RELATED SYSTEMS AND METHODS

(71) Applicant: Yale University, New Haven, CT (US)

(72) Inventors: László J. Szöcs, New Haven, CT (US); Anirudh Narla, New Haven, CT (US); Michael Hatridge, New Haven, CT (US); Katrina Sliwa, New Haven, CT (US); Shyam Shankar, New Haven, CT (US); Luigi Frunzio, North Haven, CT (US); Michel Devoret, New Haven, CT (US)

(73) Assignee: Yale University, New Haven, CT (US)

( * ) Notice: Subject to any disclaimer, the term of this patent is extended or adjusted under 35 U.S.C. 154(b) by 0 days.

(21) Appl. No.: 15/553,030

(22) PCT Filed: Feb. 26, 2016

(86) PCT No.: PCT/US2016/019821
§ 371 (c)(1),
(2) Date: Aug. 23, 2017

(87) PCT Pub. No.: WO2016/138408
PCT Pub. Date: Sep. 1, 2016

(65) Prior Publication Data
US 2018/0054165 A1     Feb. 22, 2018

Related U.S. Application Data

(60) Provisional application No. 62/126,381, filed on Feb. 27, 2015.

(51) Int. Cl.
*H03K 17/92* (2006.01)
*H03F 1/02* (2006.01)
(Continued)

(52) U.S. Cl.
CPC ............. *H03F 1/02* (2013.01); *H01L 39/223* (2013.01); *H03F 7/02* (2013.01); *H03F 7/04* (2013.01);
(Continued)

(58) Field of Classification Search
CPC ...... H03K 17/92; H03K 19/1952; H03K 3/38; G01R 13/342; G11C 11/44
(Continued)

(56) References Cited

U.S. PATENT DOCUMENTS 3,275,943 A    9/1966  Robert
3,663,886 A    5/1972  Blume
(Continued)

FOREIGN PATENT DOCUMENTS

CA    2 470 845 A1    6/2003
EP    0 513 856 A2    11/1992
(Continued)

OTHER PUBLICATIONS

Partial Supplementary European Search Report for Application No. EP 14854592.4 dated Mar. 29, 2017.
(Continued)

*Primary Examiner* — Anh Q Tra
(74) *Attorney, Agent, or Firm* — Wolf, Greenfield & Sacks, P.C.

(57) ABSTRACT

According to some aspects, a quantum circuit is provided including a plurality of non-linear circuit elements coupled together in series and in parallel, such that at least two of the circuit elements are coupled together in series and at least two of the circuit elements are coupled together in parallel, wherein the quantum circuit is configured to act as an amplifier.

17 Claims, 10 Drawing Sheets

(51) Int. Cl.
  *H01L 39/22* (2006.01)
  *H03F 19/00* (2006.01)
  *H03F 7/02* (2006.01)
  *H03F 7/04* (2006.01)
  *H03K 19/195* (2006.01)
  *G06N 10/00* (2019.01)

(52) U.S. Cl.
  CPC ........... *H03F 19/00* (2013.01); *H03K 19/195* (2013.01); *G06N 10/00* (2019.01)

(58) Field of Classification Search
  USPC .................................................. 327/366, 367
  See application file for complete search history.

(56) References Cited

U.S. PATENT DOCUMENTS

| | | | |
|---|---|---|---|
| 4,344,052 A | 8/1982 | Davidson | |
| 4,403,189 A | 9/1983 | Simmonds | |
| 4,585,999 A | 4/1986 | Hilbert et al. | |
| 4,956,312 A | 9/1990 | Van Laarhoven | |
| 5,105,166 A | 4/1992 | Tsukii et al. | |
| 5,254,950 A | 10/1993 | Fan et al. | |
| 5,326,986 A | 7/1994 | Miller, Jr. et al. | |
| 5,493,719 A | 2/1996 | Smith et al. | |
| 5,582,877 A | 12/1996 | Nagamachi et al. | |
| 5,635,834 A | 6/1997 | Sloggett et al. | |
| 5,661,494 A | 8/1997 | Bondyopadhyay | |
| 5,920,811 A | 7/1999 | Suzuki et al. | |
| 6,549,059 B1 | 4/2003 | Johnson | |
| 6,578,018 B1 | 6/2003 | Ulyanov | |
| 6,621,374 B2 | 9/2003 | Higgins et al. | |
| 6,627,915 B1 | 9/2003 | Ustinov et al. | |
| 6,635,898 B2 | 10/2003 | Williams et al. | |
| 6,822,255 B2 | 11/2004 | Tzalenchuk et al. | |
| 6,838,694 B2 | 1/2005 | Esteve et al. | |
| 6,900,454 B2 * | 5/2005 | Blais ...................... | B82Y 10/00 257/14 |
| 6,911,664 B2 | 6/2005 | Il'ichev et al. | |
| 6,943,368 B2 | 9/2005 | Amin et al. | |
| 7,042,005 B2 | 5/2006 | Il'ichev et al. | |
| 7,129,869 B2 | 10/2006 | Furuta et al. | |
| 7,253,654 B2 | 8/2007 | Amin | |
| 7,307,275 B2 | 12/2007 | Lidar et al. | |
| 7,364,923 B2 | 4/2008 | Lidar et al. | |
| 7,369,093 B2 | 5/2008 | Oppenländer et al. | |
| 7,443,720 B2 | 10/2008 | Astafiev et al. | |
| 7,498,832 B2 | 3/2009 | Baumgardner et al. | |
| 7,533,068 B2 | 5/2009 | Maassen van den Brink et al. | |
| 7,724,083 B2 | 5/2010 | Herring et al. | |
| 7,800,395 B2 | 9/2010 | Johnson et al. | |
| 7,876,248 B2 | 1/2011 | Berkley et al. | |
| 7,899,092 B2 | 3/2011 | Malinovsky | |
| 7,932,515 B2 | 4/2011 | Bunyk et al. | |
| 8,032,474 B2 | 10/2011 | Macready et al. | |
| 8,106,717 B2 | 1/2012 | Ichimura et al. | |
| 8,111,083 B1 | 2/2012 | Pesetski et al. | |
| 8,138,784 B2 | 3/2012 | Przybysz et al. | |
| 8,179,133 B1 | 5/2012 | Kornev et al. | |
| 8,416,109 B2 | 4/2013 | Kirichenko | |
| 8,508,280 B2 | 8/2013 | Naaman et al. | |
| 8,514,478 B1 | 8/2013 | Spence | |
| 8,922,239 B2 | 12/2014 | Pesetski et al. | |
| 9,467,126 B1 * | 10/2016 | Naaman ................... | H03K 3/38 |
| 9,892,365 B2 * | 2/2018 | Rigetti ................ | G06N 99/002 |
| 9,948,254 B2 | 4/2018 | Narla et al. | |
| 2001/0025012 A1 | 9/2001 | Tarutani et al. | |
| 2002/0188578 A1 | 12/2002 | Amin et al. | |
| 2003/0136973 A1 | 7/2003 | Ogawa et al. | |
| 2003/0193097 A1 | 10/2003 | Il'ichev et al. | |
| 2004/0059760 A1 | 3/2004 | Ageishi et al. | |
| 2004/0077503 A1 | 4/2004 | Blais et al. | |
| 2004/0140537 A1 | 7/2004 | Il'ichev et al. | |
| 2005/0001209 A1 * | 1/2005 | Hilton .................... | B82Y 10/00 257/20 |
| 2005/0117836 A1 | 6/2005 | Franson et al. | |
| 2005/0134377 A1 | 6/2005 | Dent | |
| 2005/0224784 A1 | 10/2005 | Amin et al. | |
| 2006/0097747 A1 | 5/2006 | Amin | |
| 2006/0179029 A1 | 8/2006 | Vala et al. | |
| 2007/0215862 A1 | 9/2007 | Beausoleil et al. | |
| 2007/0296953 A1 | 12/2007 | Allen et al. | |
| 2008/0100175 A1 | 5/2008 | Clark | |
| 2008/0274898 A1 | 11/2008 | Johnson et al. | |
| 2008/0297230 A1 | 12/2008 | Dzurak et al. | |
| 2009/0028340 A1 | 1/2009 | Trifonov | |
| 2009/0033369 A1 | 2/2009 | Baumgardner et al. | |
| 2009/0074355 A1 | 3/2009 | Beausoleil et al. | |
| 2009/0153180 A1 | 6/2009 | Herring et al. | |
| 2009/0232191 A1 | 9/2009 | Gupta et al. | |
| 2009/0258787 A1 | 10/2009 | Wilkie et al. | |
| 2009/0289638 A1 | 11/2009 | Farinelli et al. | |
| 2010/0241780 A1 | 9/2010 | Friesen | |
| 2010/0246152 A1 | 9/2010 | Lin et al. | |
| 2011/0060710 A1 | 3/2011 | Amin | |
| 2011/0079889 A1 | 4/2011 | Baillin | |
| 2012/0074509 A1 | 3/2012 | Berg et al. | |
| 2012/0319085 A1 | 12/2012 | Gambetta et al. | |
| 2012/0319684 A1 | 12/2012 | Gambetta et al. | |
| 2012/0326130 A1 | 12/2012 | Maekawa et al. | |
| 2012/0326720 A1 | 12/2012 | Gambetta et al. | |
| 2013/0029848 A1 | 1/2013 | Gonzalez et al. | |
| 2013/0043945 A1 | 2/2013 | McDermott et al. | |
| 2013/0107352 A1 | 5/2013 | Santori et al. | |
| 2013/0196855 A1 | 8/2013 | Poletto et al. | |
| 2013/0271265 A1 | 10/2013 | Finn | |
| 2014/0167836 A1 * | 6/2014 | Gambetta ............ | H03K 19/195 327/528 |
| 2014/0314419 A1 | 10/2014 | Paik | |
| 2015/0241481 A1 | 8/2015 | Narla et al. | |
| 2016/0308502 A1 | 10/2016 | Abdo et al. | |
| 2017/0039481 A1 | 2/2017 | Abdo | |
| 2018/0040935 A1 | 2/2018 | Sliwa et al. | |
| 2018/0138987 A1 | 5/2018 | Sliwa et al. | |
| 2018/0198427 A1 | 7/2018 | Narla et al. | |
| 2019/0020346 A1 | 1/2019 | Wang et al. | |

FOREIGN PATENT DOCUMENTS

| | | |
|---|---|---|
| EP | 2 249 173 A1 | 11/2010 |
| EP | 2 264 799 A1 | 12/2010 |
| GB | 1 370 647 A | 10/1974 |
| JP | 2-924421 B2 | 7/1999 |
| JP | 2006-344761 A | 12/2006 |
| RU | 2 106 717 C1 | 3/1998 |
| RU | 2 212 671 C1 | 9/2003 |
| RU | 2010 124 198 A | 12/2011 |
| WO | WO 2017/065856 A1 | 4/2017 |

OTHER PUBLICATIONS

Extended European Search Report for European Application No. EP 14854592.4 dated Aug. 10, 2017.
International Search Report and Written Opinion for International Application No. PCT/US2014/060694 dated Apr. 2, 2015.
International Preliminary Report on Patentability for International Application No. PCT/US2014/060694 dated Apr. 28, 2016.
Extended European Search Report for European Application No. EP 16756465.7 dated Sep. 28, 2018.
International Search Report and Written Opinion for International Application No. PCT/US2016/019821 dated May 6, 2016.
International Preliminary Report on Patentability for International Application No. PCT/US2016/019821 dated Sep. 8, 2017.
Extended European Search Report for European Application No. EP 16756463.2 dated Sep. 7, 2018.
International Search Report and Written Opinion for International Application No. PCT/US2016/019819 dated May 3, 2016.
International Preliminary Report on Patentability for International Application No. PCT/US2016/019819 dated Sep. 8, 2017.
Extended European Search Report for European Application No. 16780864.1, dated Mar. 5, 2019.

(56) References Cited

OTHER PUBLICATIONS

Invitation to Pay Additional Fees for International Application No. PCT/US2016/027817 dated Jun. 3, 2016.
International Search Report and Written Opinion for International Application No. PCT/US2016/027817 dated Aug. 22, 2016.
International Preliminary Report on Patentability for International Application No. PCT/US2016/027817 dated Oct. 26, 2017.
International Search Report and Written Opinion for International Application No. PCT/US2017/013426 dated Apr. 5, 2017.
International Preliminary Report on Patentability for International Application No. PCT/US2017/013426 dated Jul. 26, 2018.
International Search Report and Written Opinion for International Application No. PCT/US2018/064922, dated Mar. 8, 2019.
Abdo et al., Full coherent frequency conversion between two propagating microwave modes. Phys Rev Lett. Apr. 26, 2013;110:173902.1-5. doi: 10.1103/PhysRevLett.110.173902.
Abdo et al., Josephson amplifier for qubit readout. Appl Phys Lett. 2011; 99(16): 162506. doi: 10.1063/1.3653473.
Abdo et al., Josephson directional amplifier for quantum measurement of superconducting circuits. Phys Rev Lett. Apr. 25, 2014;112:167701.1-5. doi: 10.1103/PhysRevLett.112.167701.
Abdo et al., Nondegenerate three-wave mixing with the Josephson ring modulator. Phys Rev B. Jan. 16, 2013;87(1):014508.1-18. doi: 10.1103/PhysRevB.87.014508.
Albert et al., Holonomic quantum computing with cat-codes. Apr. 10, 2015. arXiv:1503.00194v2. 5 pages.
Albert et al., Symmetries and conserved quantities in Lindblad master equations. Phys Rev A. Feb. 2014;89(2):022118. arXiv:1310.1523v2. 15 pages.
Araujo et al., A LEKID-based CMB instrument design for large-scale observations in Greenland. Proc of SPIE—The International Society for Optical Engineering. Aug. 4, 2014;9153:91530W. doi: 10.1117/12.2056828.
Barends et al., Minimizing quasiparticle generation from stray infrared light in superconducting quantum circuits, Appl Phys Lett. Sep. 13, 2011;99(11):113507.
Bergeal et al., Analog information processing at the quantum limit with a Josephson ring modulator. Nat Phys. Apr. 2010;6(4):296-302. doi: 10.1038/NPHYS1516. Epub Feb. 14, 2010. 7 pages.
Bergeal et al., Phase-preserving amplification near the quantum limit with a Josephson ring modulator. Nature. May 2010;465(7294):64-8. arXiv:0912.3407v1. 20 pages.
Bergeal et al., Phase-preserving amplification near the quantum limit with a Josephson ring modulator. Nature. 2010;465:64-9.
Bockstiegel et al., Development of broadband NbTiN traveling wave parametric amplifier for MKID readout. J Low Temp Phys. 2014;176:476-82.
Burgarth et al., Non-Abelian phases from quantum Zeno dynamics. Phys Rev A. Oct. 9, 2013;88:042107.1-5. doi: 10.1103/PhysRevA.88.042107.
Campagne-Ibarcq et al., Observing quantum state diffusion by heterodyne detection of fluorescence. Phys Rev X. 2016;6:011002.
Campagne-Ibarcq et al., Persistent control of a superconducting qubit by stroboscopic measurement feedback. Phys Rev X. 2013;3:1-7. arXiv:1301.6095v2.
Carollo et al., Coherent Quantum Evolution via Reservoir Driven Holonomy. Phys Rev Lett. Jan. 18, 2006;96;020403. arXiv:quant-ph/0507229v2. 4 pages.
Carollo et al., Geometric Phase Induced by a Cyclically Evolving Squeezed Vacuum Reservoir. Phys Rev Lett. Apr. 21, 2006;96:150403. arXiv:quant-ph/0507102v2. 5 pages.
Castellanos-Beltran et al., Amplification and squeezing of quantum noise with a tunable Josephson metamaterial. Nat Phys. Dec. 2008;4(12):928-31.
Castellanos-Beltran et al., Widely tunable parametric amplifier based on a superconducting quantum interference device array resonator. Applied Physics Letters. 2007;91(8). 4 pages.
Catelani et al., Relaxation and frequency shifts induced by quasiparticles in superconducting qubits, Phys Rev B. 2011;84(6) 064517.

Caves, Quantum limits on noise in linear amplifiers. Phys. Rev. D. 1982;26(8):1817-39.
Chaturvedi et al., Berry's phase for coherent states. J Phys A: Math Gen. 1987;20(16):L1071-5.
Corcoles et al., Protecting superconducting qubits from radiation. App Phys Lett. 2011;99(18):181906.
Court et al., Quantitative study of quasiparticle traps using the single-Cooper-pair transistor. Phys Rev B. 2008;77(10):100501.
Dasgupta et al., Decoherence-induced geometric phase in a multi-level atomic system. J Phys B: At Mol Opt Phys. Apr. 18, 2007;40(9):S127. arXiv:quant-ph/0612201v1. 10 pages.
De Lange et al., Reversing quantum trajectories with analog feedback. Phys Rev Lett. 2014;112:080501.
De Ponte et al., Relaxation- and decoherence-free subspaces in networks of weakly and strongly coupled resonators. Ann Phys. Mar. 12, 2007;322:2077-84.
Devoret et al., Superconducting Circuits for Quantum Information: An Outlook. Science. Mar. 8, 2013;339:1169-74. doi: 10.1126/science.1231930.
Dolan, Offset masks for lift-off photoprocessing. App Phys Lett. 1977;31(5):337-9.
Duan et al., Preserving Coherence in Quantum Computation by Pairing Quantum Bits. Phys Rev Lett. Sep. 8, 1997;79(10-8):1953-6.
Eichler et al., Controlling the dynamic range of a Josephson parametric amplifier. EPJ Quantum Tech. Jan. 29, 2014;1(2). doi:10.1140/epjqt2. 19 pages.
Facchi et al., Quantum Zeno Subspaces. Phys Rev Lett. Aug. 19, 2002;89(8):080401.1-4.
Flurin et al., Superconducting quantum node for entanglement and storage of microwave radiation. Phys Rev Lett. Mar. 6, 2015;114(9):090503. Epub Mar. 4, 2015.
Flurin et al., Generating entangled microwave radiation over two transmission lines. Phys Rev Lett. Nov. 2, 2012;109(18):183901. Epub Oct. 31, 2012.
Frattini et al., 3-wave mixing Josephson dipole element. App Phys Lett. 2017;110:222603-4.
Friedrich et al., Experimental quasiparticle dynamics in a superconducting, imaging x-ray spectrometer, App Phys Lett. 1997;71(26):3901.
Golubov et al., Quasiparticle lifetimes and tunneling times in a superconductor-insulator-superconductor tunnel junction with spatially inhomogeneous electrodes. Phys Rev B Condens Matter. May 1, 1994;49(18):12953-68.
Gueron, Quasiparticles in a diffusive conductor: interaction and pairing, Universite Pierre et Marie Curie—Paris VI. 1997, 241 pages.
Hatridge et al., Dispersive magnetometry with a quantum limited SQUID parametric amplifier. Phys Rev B. Apr. 2011;83(13):134501-1-8.
Hatridge et al., Quantum back-action of an individual variable-strength measurement. Science. Jan. 11, 2013; 339(6116): 178-81. doi: 10.1126/science.1226897.
Heeres et al., Cavity State Manipulation Using Photon-Number Selective Phase Gates. Phys Rev Lett. Sep. 25, 2015;115:137002.1-5. doi: 10.1103/PhysRevLett.115.137002.
Ho Eom et al., A wideband, low-noise superconducting amplifier with high dynamic range. Nature Physics. 2012;8(8):623-7.
Hofheinz et al., Synthesizing arbitrary quantum states in a superconducting resonator. Nature. May 28, 2009;459:546-9. doi:10.1038/nature08005. Supplementary Information. 6 pages.
Houck et al., Life after charge noise: recent results with transmon qubits. Quantum Info Process. Feb. 11, 2009;8(2-3):105-15.
Hover et al., High fidelity qubit readout with the superconducting lowinductance undulatory galvanometer microwave amplifier. Appl Phys Lett. 2014;104;152601.1-4.
Hover et al., Superconducting Low-inductance Undulatory Galvanometer Microwave Amplifier. Appl Phys Lett. Feb. 7, 2012;100:063503.1-3.
Johnson et al., Dispersive readout of a flux qubit at the single photon level. Phys Rev B. 2011;84:220503. arXiv:1109.2858v2. 5 pages.
Kamal et al., Gain, directionality, and noise in microwave SQUID amplifiers: Input-output approach. Phys Rev B. 2012;86:144510.1-12. doi: 10.1103/PhysRevB.86.144510.

(56) References Cited

OTHER PUBLICATIONS

Kamal et al., Noiseless nonreciprocity in a parametric active device. Nature Physics. 2011;7:311-315.

Kamal et al., Signal-to-pump back action and self-oscillation in double-pump Josephson parametric amplifier. Phys. Rev. B. May 13, 2009;79:184301.

Kerckhoff et al., On-chip superconducting microwave circulator from synthetic rotation. Phys Rev Appl. 2015;4:034002. arXiv:1502.06041. Submitted Feb. 21, 2015. 13 pages.

Kirchmair et al., Observation of quantum state collapse and revival due to the single-photon Kerr effect. Nature. Mar. 14, 2013;495:205-9. doi:10.1038/nature11902.

Knill et al., Theory of Quantum Error Correction for General Noise. Phys Rev Lett. Mar. 13, 2000;84(11):2525-8. arXiv:quant-ph/9908066v1. 6 pages.

Koch et al., Time-reversal symmetry breaking in circuit-QED based photon lattices. arXiv:1006.0762v2. Oct. 11, 2010. 19 pages.

Krastanov et al., Universal Control of an Oscillator with Dispersive Coupling to a Qubit. Phys Rev A. 2015;92:040303. arXiv:1502.08015. Submitted Feb. 27, 2015. 5 pages.

Lähteenmäki et al., Advanced Concepts in Josephson Junction Reflection Amplifiers. Journal of Low Temperature Physics. 2014;175(5-6):868-76.

Leghtas et al., Confining the state of light to a quantum manifold by engineered two-photon loss. Dec. 16, 2014. arXiv:1412.4633v1. 29 pages.

Lidar et al., Decoherence Free Subspaces for Quantum Computation. Phys Rev Lett. Sep. 21, 1998;81(12):2594-7. arXiv:quant-ph/9807004v2. 4 pages.

Lindblad, On the generators of quantum dynamical semigroups. Commun Math Phys. 1976;48(2):119-30.

Liu et al., Comparing and combining measurement-based and driven-dissipative entanglement stabilization. Phys. Rev. X. 2016;6:011022.

Macleod et al., Periodicity in Al/Ti superconducting single electron transistors. App Phys Lett. Aug. 3, 2009;95:052503.

Martinis et al., Calculation of Tc in a normal-superconductor bilayer using the microscopic-based Usadel theory. Nucl Instrum Methods Phys Res A. 2000;444(1)2:23-27.

Martinis et al., Energy decay in superconducting Josephson-Junction qubits from nonequilibrium quasiparticle excitations. Phys Rev Lett. 2009;103(9):097002.

Metelmann et al., Nonreciprocal photon transmission and amplification via reservoir engineering. Phys. Rev. X. 2015(5):021025.

Minev et al., Planar Superconducting Whispering Gallery Mode Resonators. Appl Phys Lett. Oct. 3, 2013;103:142604.1-3. doi: 10.1063/1.4824201.

Mirrahimi et al., Dynamically protected cat-qubits: a new paradigm for universal quantum computation. New J Phys. Apr. 22, 2014;16:045014. 31 pages.

Mousolou et al., Universal non-adiabatic holonomic gates in quantum dots and single-molecule magnets. New J Phys. Jan. 17, 2014;16:013029. 10 pages.

Mück et al., Superconducting Quantum Interference Device as a Near-Quantum-Limited Amplifier at 0.5 GHz. Appl Phys Lett. Feb. 12, 2001;78(7):967-9. doi: 10.1063/1.1347384.

Murch et al., Observing single quantum trajectories of a superconducting quantum bit. Nature. Oct. 10, 2013;502(7470):211-4. doi: 10.1038/nature12539.

Mutus et al., Design and characterization of a lumped element single-ended superconducting microwave parametric amplifier with on-chip flux bias line. App Phys Lett. Sep. 17, 2013;103:122602.

Narla et al., Robust concurrent remote entanglement between two superconducting qubits. Phys Rev X. 2016;6:031036.

Narla et al., Wireless Josephson amplifier. Appl Phys Lett. 2014;104:232605. doi: 10.1063/1.4883373. 6 pages.

Nsanzineza et al., Trapping a single vortex and reducing quasiparticles in a superconducting resonator. Phys Rev Lett. Sep. 12, 2014;113(11):117002. Epub Sep. 12, 2014.

O'Brien et al., Resonant Phase Matching of Josephson Junction Traveling Wave Parametric Amplifiers. Phys Rev Lett. Oct. 10, 2014;113:157001.1-5.

Ofek et al., Demonstrating quantum error correction that extends the lifetime of quantum information. Nature. 2016;536:441-445.

Oreshkov et al., Adiabatic Markovian Dynamics. Phys Rev Lett. Jul. 30, 2010;105(5):050503. arXiv:1002.2219v4. 7 pages.

Oreshkov et al., Fault-Tolerant Holonomic Quantum Computation. Phys Rev Lett. Feb. 20, 2009;102:070502.1-4.

Oreshkov, Holonomic Quantum Computation in Subsystems. Phys Rev Lett. Aug. 28, 2009;103(9):090502. arXiv:0905.1249v3. 5 pages.

Pachos et al., Decoherence-free dynamical and geometrical entangling phase gates. Phys Rev A. 2004;69:033817. arXiv:quant-ph/0309180v3. 10 pages.

Paik et al., Observation of High Coherence in Josephson Junction Qubits Measured in a Three-Dimensional Circuit QED Architecture. Phys Rev Lett. Dec. 5, 2011;107(24):240501. arXiv:1105.4652v4. 5 pages.

Paz-Silva et al., Zeno Effect for Quantum Computation and Control. Phys Rev Lett. Feb. 24, 2012;108(8):080501. arXiv:1104.5507v2. 7 pages.

Peltonen et al., Magnetic-field-induced stabilization of nonequilibrium superconductivity in a normal-metal/insulator/superconductor junction. Phys Rev B. 2011;84(22):220502.

Pillet et al., Optimal design for the Josephson mixer. Mar. 30, 2015. arXiv:1503.08185v1. 5 pages.

Pillet, Amplification, entanglement and storage of microwave radiation using superconducting circuits. University of Virginia. Seminar. 2014;1-78.

Platenberg, Coupled superconducting flux qubits. Delft University of Technology. Thesis. 2007. 153 pages.

Pop et al., Coherent suppression of electromagnetic dissipation due to superconducting quasiparticles. Nature. Apr. 17, 2014;508(7496):369-72. doi: 10.1038/nature13017.

Ranzani et al., Graph-based analysis of nonreciprocity in coupled-mode systems. New J Phys. Oct. 15, 2014;17:023024. arXiv 2014;1406.4922v2. 21 pages.

Rigetti et al., Superconducting qubit in a waveguide cavity with a coherence time approaching 0.1 ms. Phys Rev B. 2012;86:100506.

Ristè et al., Feedback Control of a Solid-State Qubit Using High-Fidelity Projective Measurement. Phys Rev Lett. Dec. 2012;109(24):240502. arXiv:1207.2944v1 [cond-mat.mes-hall]. 9 pages.

Ristè et al., Millisecond charge-parity fluctuations and induced decoherence in a superconducting transmon qubit. Nat Commun. 2013;4:1913. doi: 10.1038/ncomms2936.

Roch et al., Observation of measurement-induced entanglement and quantum trajectories of remote superconducting qubits. Phys Rev Lett. May 2, 2014;112:170501.1-5.

Roch et al., Widely Tunable, Non-degenerate Three-Wave Mixing Microwave Device Operating near the Quantum Limit. Phys Rev Lett. Apr. 2012;108(14):147701. arXiv:1202.1315v1 [cond-mat.mes-hall]. 5 pages.

Sarandy et al., Abelian and non-Abelian geometric phases in adiabatic open quantum systems. Phys Rev A. Jun. 2006;73(6):062101. arXiv:quant-ph/0507012v3. 10 pages.

Schackert et al., A Practical Quantum-Limited Parametric Amplifier Based on the Josephson Ring Modulator. A Dissertation Presented to the Faculty of the Graduate School of Yale University in Candidacy for the Degree of Doctor of Philosophy. Dec. 2013.

Schackert et al., Phase-preserving amplification near the quantum limit with a Josephson ring modulator. Nature. May 2010;465(7294):64-8. arXiv:0912.3407v1. 20 pages.

Schindler et al., Quantum simulation of open-system dynamical maps with trapped ions. Nature Phys. May 19, 2013;9:361-7. arXiv:1212.2418v1. 28 pages.

Segall et al., Dynamics and energy distribution of nonequilibrium quasiparticles in superconducting tunnel junctions. Physical Review B. 2004;70(21):214520.

Shankar et al., Autonomously stabilized entanglement between two superconducting quantum bits. Nature. Dec. 19, 2013;504(7480):419-22. doi:10.1038/nature12802. Epub Nov. 24, 2013.

(56) References Cited

OTHER PUBLICATIONS

Shaw et al., Kinetics of nonequilibrium quasiparticle tunneling in superconducting charge qubits. Phys Rev B. Jul. 1, 2008;78:024503.
Siddiqi et al., An RF-Driven Josephson Bifurcation Amplifier for Quantum Measurements. Phys Rev Lett. Nov. 10, 2004;93:207002. arXiv:cond-mat/0312623v1. 4 pages.
Silveri et al., Theory of remote entagelment via quantum limited phase-preserving amplification. Phys Rev A. Jun. 7, 2016;93:062310.
Sirois et al., Coherent-state storage and retrieval between superconducting cavities using parametric frequency conversion. Appl Phys Lett. Apr. 30, 2015;106:172603.
Sjöqvist, Trends: A new phase in quantum computation. Phys. 2008;1:35. doi: 10.1103/Physics.1.35. 6 pages.
Sliwa et al., Reconfigurable Josephson Circulator/Directional Amplifier. Phys. Rev. X 2015;5:041020.
Smith et al., Low noise papametric amplifier. IEEE Transactions on Magnetics. Mar. 1985;MAG-21(2):1022-8.
Spietz et al., Input Impedance and Gain of a Gigahertz Amplifier Using a DC SQUID in a Quarter Wave Resonator. Appl Phys Lett. Jun. 17, 2008;93:082506. arXiv:0806.2853v1. 4 pages.
Sun et al., Measurements of Quasiparticle Tunneling Dynamics in a Band-Gap-Engineered Transmon Qubit. Phys Rev Lett. Jun. 8, 2012;108:230509. doi: 10.1103/PhysRevLett.108.230509.
Sun et al., Tracking photon jumps with repeated quantum non-demolition parity measurements. Nature. Jul. 24, 2014;511(7510):444-8. doi: 10.1038/nature13436. Epub Jul. 13, 2014.
Swenson et al., High-speed phonon imaging using frequency-multiplexed kinetic inductance detectors,. App Phys Lett. Jul. 1, 2010; 96:263511.
Usadel, Generalized Diffusion Equation for Superconducting Alloys. Phys Rev Lett. 1970;25(8):507.
Vijay et al., Invited Review Article: The Josephson bifurcation amplifier. Rev Sci Instrum. Nov. 17, 2009;80:111101. doi:10.1063/1.3224703.
Vijay et al., Observation of Quantum Jumps in a Superconducting Artificial Atom. Phys Rev Lett. Mar. 18, 2011;106(11):110502.1-4.
Vijay et al., Quantum feedback control of a superconducting qubit: Persistent Rabi oscillations. Nature. Oct. 4, 2012;490(7418):77-80. doi: 10.1038/nature11505.
Vion et al., Manipulating the quantum state of an electrical circuit. Science. May 3, 2002;296(5569):886-9.
Visser et al., Fluctuations in the electron system of a superconductor exposed to a photon flux. Nat Commun. 2014;5:3130. doi: 10.1038/ncomms4130.
Vool et al., Non-Poissonian quantum jumps of a fluxonium qubit due to quasiparticle excitations. Phys Rev Lett. Dec. 12, 2014;113(24):247001. Epub Dec. 8, 2014.
Wang et al., a Schrödiner cat living in two boxes. Science. May 27, 2016;352(6289):1087.
Wang et al., Measurement and control of quasiparticle dynamics in a superconducting qubit, Nature Comms. Dec. 18, 2014; 5:5836. doi:10.1038/ncomms6836.
Wang, Memristors and Superconducting Quantum Interference Filters in RF Systems. Department of Electrical and Computer Engineering, Duke University. Thesis. Aug 18, 2014. 119 pages.
Wendin et al., Superconducting quantum circuits, qubits and computing. arXiv:cond-mat/0508729v1. Aug. 30, 2005. 60 pages.
Wenner et al., Excitation of superconducting qubits from hot nonequilibrium quasiparticles. Phys Rev Lett. Apr. 12, 2013;110(15):150502. Epub Apr. 9, 2013.
Wu et al., Time-dependent decoherence-free subspace. J Phys A: Math. Theor. Sep. 19, 2012;45(40):405305. arXiv:1205.1298v2. 7 pages.
Xu et al., Non-Adiabatic Holonomic Quantum Computation in Decoherence-Free Subspaces. Phys Rev Lett. Oct. 24, 2012;109(17):170501. arXiv:1210.6782v1. 4 pages.
Xu et al., Universal Nonadiabatic Geometric Gates in Two-Qubit Decoherence-Free Subspaces. Sci Rep. Oct. 29, 2014;4:6814. doi: 10.1038/srep06814. 5 pages.
Yaakobi et al., Parametric amplification in Josephson junction embedded transmission lines. Phys Rev B. Apr. 1, 2013;87:144301. 1-9. doi: 10.1103/PhysRevB.87.144301.
Yamamoto et al., Flux-driven Josephson parametric amplifier. Appl Phys Lett Jul. 2008;93:042510. doi:10.1063/1.2964182.
Zanardi et al., Coherent quantum dynamics in steady-state manifolds of strongly dissipative systems. Phys Rev Lett. Dec. 17, 2014;113:240406. arXiv:1404.4673. 6 pages.
Zanardi et al., Geometry, robustness, and emerging unitarity in dissipation-projected dynamics. Phys Rev A. 2015;91:052324. arXiv:1412.6198. 8 pages.
Zanardi et al., Holonomic Quantum Computation. Phys Lett A. Nov. 15, 1999;264:94-9. 5 pages.
Zanardi et al., Noiseless Quantum Codes. Phys Rev Lett. Oct. 27, 1997;79(17):3306-9. arXiv:quant-ph/9705044v2. 4 pages.
Zanardi, Stabilizing Quantum Information. Phys Rev A. Dec. 5, 2000;63(1):012301. arXiv:quant-ph/9910016v2. 5 pages.
Zanardi, Virtual Quantum Subsystems. Phys Rev Lett. Aug. 13, 2001;87(7):077901. arXiv:quant-ph/0103030v2. 4 pages.
Zhang et al., Physical implementation of holonomic quantum computation in decoherence-free subspaces with trapped ions. Phys Rev A. 2006;74:034302. arXiv:quant-ph/0608068v1. 4 pages.
Zheng, Dissipation-induced geometric phase for an atom in cavity QED. Phys Rev A. May 10, 2012;85(5):052106. arXiv:1205.0984v2. 7 pages.
Zheng, Open-system geometric phase based on system-reservoir joint state evolution. Phys Rev A. Jun. 27, 2014;89:062118. arXiv:1405.1227v1. 8 pages.
Zhong et al., Squeezing with a flux-driven Josephson parametric amplifier. New J Phys. Dec. 2013;15:125013. doi:10.1088/1367-2630/15/12/125013.
Zhou et al., High-gain weakly nonlinear flux-modulated Josephson parametric amplifier using a SQUID array. Physical Review. 2014;89(21). 6 pages.
Zhu et al., Geometric quantum gates robust against stochastic control errors. Phys Rev A. Aug. 15, 2005;72(2):020301. arXiv:quant-ph/0407177v1. 4 pages.
Zorin, Josephson Traveling-Wave Parametric Amplifier with Three-Wave Mixing. Phys Rev Applied. Sep. 12, 2016;6:034006.
Zueco et al., Qubit-oscillator dynamics in the dispersive regime: analytical theory beyond the rotating-wave approximation. Physical Review A 80.3 2009. 6 pages.

* cited by examiner

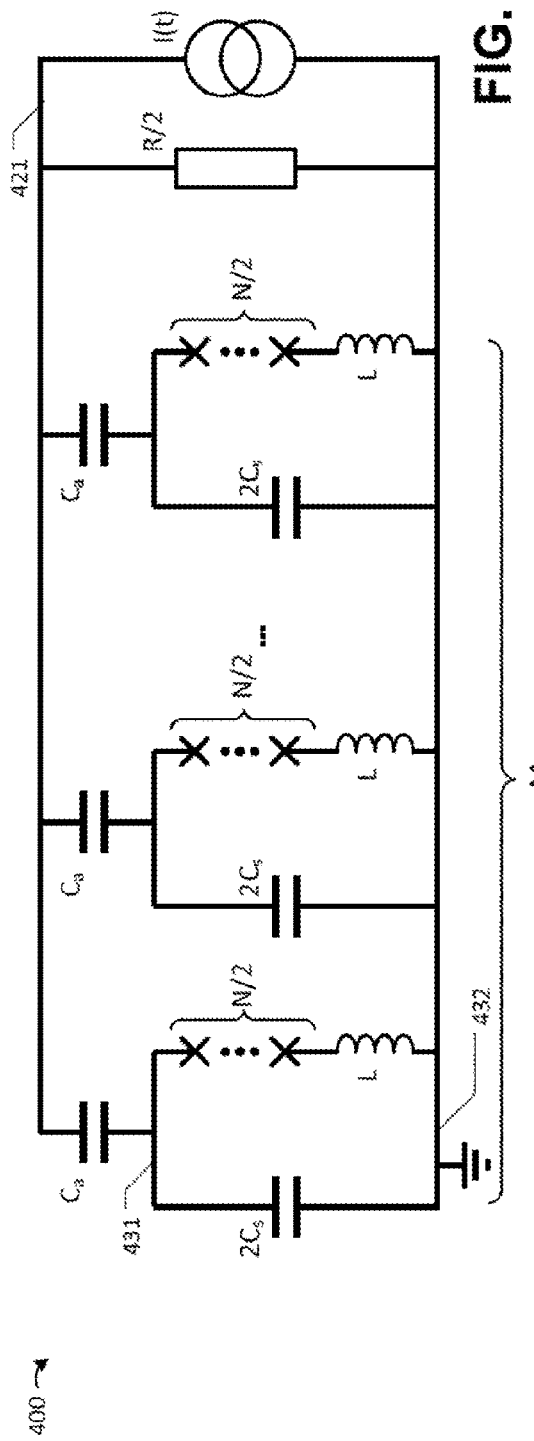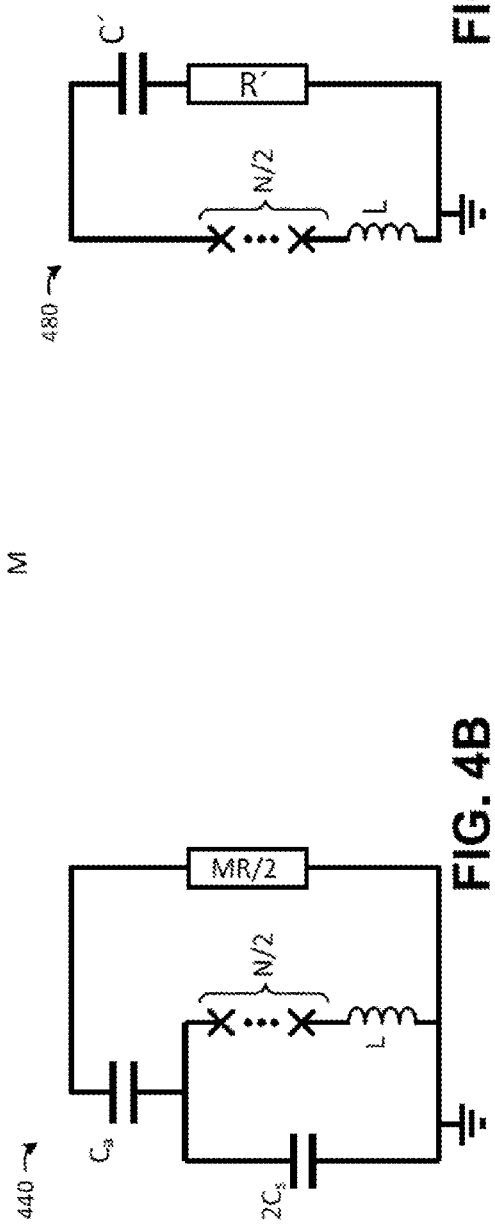
FIG. 4A
FIG. 4B
FIG. 4C

US 10,404,214 B2

TECHNIQUES FOR PRODUCING QUANTUM AMPLIFIERS AND RELATED SYSTEMS AND METHODS

CROSS-REFERENCE TO RELATED APPLICATIONS

This application is the national phase filing under 35 U.S.C. § 371 of International Application No. PCT/US2016/019821, filed on Feb. 26, 2016, which claims priority to U.S. Provisional Patent Application No. 62/126,381, filed on Feb. 27, 2015, each of which are incorporated herein by reference to the maximum extent allowable.

FIELD

The present application relates generally to quantum information processing. More specifically, the present application relates to techniques for producing quantum amplifiers.

BACKGROUND

Amplifiers are ubiquitous components in experimental physics, and are typically used to raise the energy of a signal coming from a measurement device to a level sufficient to exceed the noise of the electronics used to read the signal. Conventional amplifiers are dissipative and generally generate a certain amount of noise in addition to an amplified output signal in response to an input signal applied to an input terminal.

Quantum information processing uses quantum mechanical phenomena, such as energy quantization, superposition, and/or entanglement, to encode and process information in a way not utilized by conventional information processing. It is expected that certain computational problems may be solved more efficiently using quantum computation rather than conventional classical computation. Due to the low energies used in a quantum circuit, measurements of a quantum circuit require amplification before they can be read at a macroscopic (non-quantum) scale. Conventional amplifiers are, however, unsuitable for use in quantum circuits as they introduce too much noise to produce a useable output signal and exhibit poor sensitivity to the low energies of a quantum circuit.

SUMMARY

Some aspects are directed to a quantum circuit, comprising a plurality of non-linear circuit elements coupled together in series and in parallel, such that at least two of the circuit elements are coupled together in series and at least two of the circuit elements are coupled together in parallel, wherein the quantum circuit is configured to act as an amplifier.

According to some embodiments, the quantum circuit elements are Josephson junctions.

According to some embodiments, N of the circuit elements are coupled together in series within a sub-circuit of the quantum circuit, and a plurality of said sub-circuits are coupled together in parallel M times within the quantum circuit.

According to some embodiments, N is at least 3 and M is at least 3.

According to some embodiments, the quantum circuit further comprises a first capacitor within each of the plurality of sub-circuits.

According to some embodiments, the quantum circuit further comprises at least one inductor within each of the plurality of sub-circuits.

According to some embodiments, the at least one inductor includes one or more of the circuit elements.

According to some embodiments, the at least one inductor includes one or more inductors distinct from the one or more circuit elements.

According to some embodiments, the quantum circuit further comprises a plurality of second capacitors each coupled between neighboring pairs of the sub-circuits.

According to some embodiments, the plurality of non-linear circuit elements are substantially identical to one another.

According to some embodiments, the quantum circuit is configured to operate the plurality of circuit elements in a hybrid common mode.

BRIEF DESCRIPTION OF DRAWINGS

Various aspects and embodiments will be described with reference to the following figures. It should be appreciated that the figures are not necessarily drawn to scale. In the drawings, each identical or nearly identical component that is illustrated in various figures is represented by a like numeral. For purposes of clarity, not every component may be labeled in every drawing.

FIGS. 4A-4C illustrate reduced circuit representations of the circuit depicted in FIG. 3, according to some embodiments;

DETAILED DESCRIPTION

An amplifier receives an input signal from an experimental object and increases the magnitude of the signal as output. The input signal typically includes a noise component from one or more noise sources, and an amplifier may increase the magnitude of this component while also introducing new sources of noise in its output. An efficient amplifier will perform the task of increasing the energy of the information-laden portion of its input (the signal from the experimental object) without introducing too much noise output that makes separation of the amplified signal from noise more difficult. The "gain" of an amplifier is the increase in amplitude of the output of an amplifier (including noise) relative to its input, and the "bandwidth" of an amplifier is the range of input frequencies over which the amplifier can produce an amplified output.

Quantum amplifiers are amplifiers that use quantum mechanical techniques to amplify a quantum signal in an information conserving manner. In some cases, a quantum signal might contain only a few quantum excitations (e.g., photons). Quantum amplifiers typically utilized Josephson junctions, which are non-linear and dissipation-less circuit elements. While such elements can be operated as quantum amplifiers, the dynamic range of these devices can be limited. An amplifier's dynamic range is the ratio between the largest and smallest input signals that can be effectively amplified, and it may be beneficial for a quantum amplifier to have a high dynamic range relative to its gain and bandwidth. For instance, a quantum amplifier with a relatively low dynamic range may only be able to amplify input signals that comprise energy corresponding to between 3 and 5 photons, which would limit the usage of such a device in quantum circuits.

Figure 1:
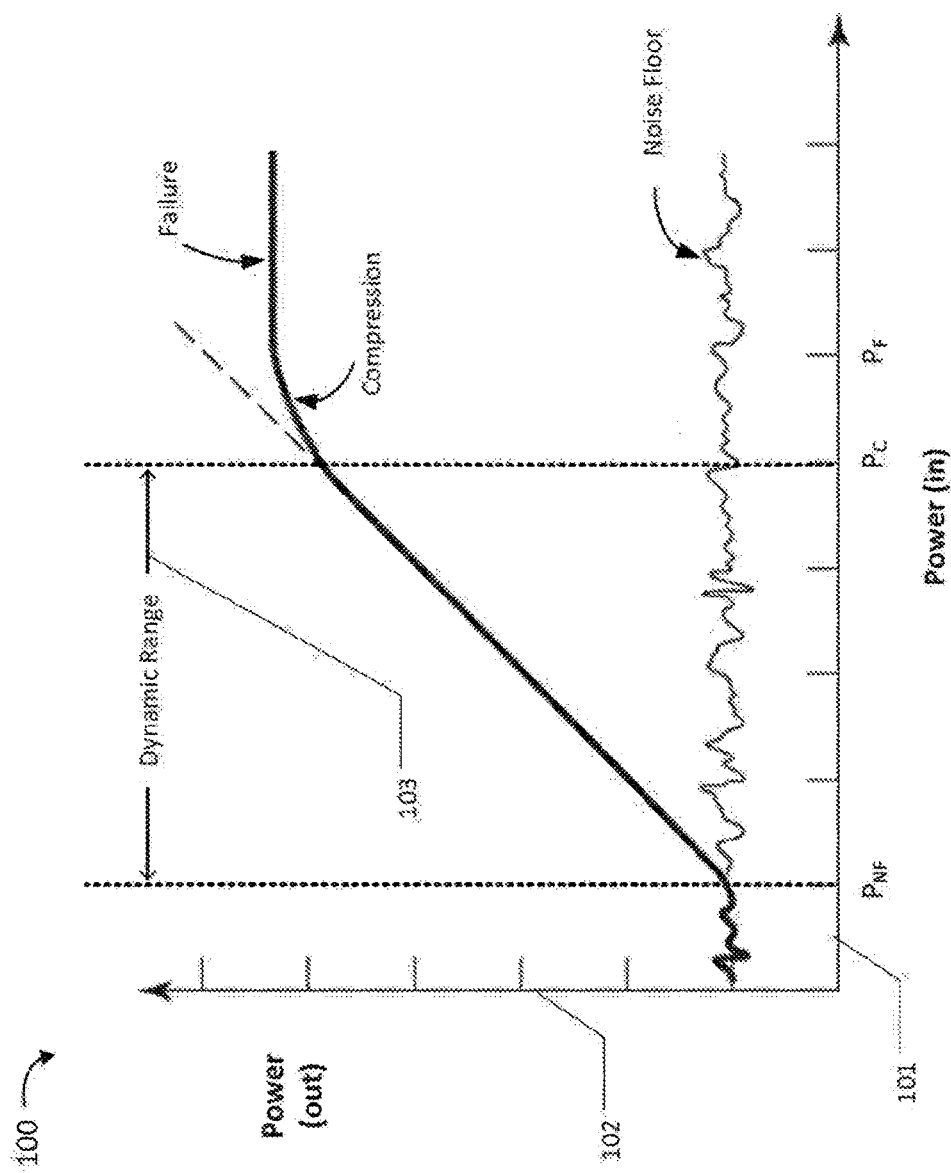
FIG. 1 is a graph depicting the performance of an illustrative quantum amplifier.

FIG. 1 depicts the performance of an illustrative quantum amplifier. In the example of FIG. 1, the horizontal axis 101 of the graph 100 represents the power input to the amplifier and the vertical axis represents the power output from the amplifier. The input power could include a measurement signal as well as one or more sources of noise. Below an input power $P_{NF}$, the amplifier output is dominated by only noise represented by a noise floor. In a quantum amplifier, the noise floor is due to the uncertainty of physical quantities that are inherent to quantum measurements, and an ideal quantum amplifier would not produce noise greater than the quantum noise floor. A quantum amplifier that adds only the minimum amount of noise due to the inherent uncertainty of quantum measurements is sometimes referred to as being "quantum-limited."

In the example of FIG. 1, in a region 103 between input powers $P_{NF}$ and $P_C$ the amplifier produces output power that scales linearly with input power. The slope of this region of the graph 100 is the amplifier's gain. Above an input power $P_C$, the amplifier begins to deviate from the linear gain in the compression region and finally the amplifier gain drops to unity (sometimes referred to as "failure") above input power $P_F$, where the output power becomes constant independent of the input power. The dynamic range of the amplifier is, as shown, the difference in power between the point at which the amplifier produces output above the noise floor (input power $P_{NF}$) and the point at which compression begins (input power $P_C$). There are various ways to measure each of these points, and the illustrated figure is not intended to limit the definition of dynamic range to any particular technique. For example, $P_C$ may be the so-called "1 dB compression point," at which the output power drops to 1 dB below what the output power would be if the amplifier were producing output according to its gain. However, this is just one example of determining one edge of the dynamic range and generally any suitable technique may be used.

The inventors have recognized and appreciated that a quantum amplifier with improved dynamic range may be realized by producing a circuit in which multiple quantum circuit elements are arranged both in series and in parallel. The quantum circuit elements may be able to be operated as an amplifier when used in isolation, yet may combine within the quantum circuit to produce amplification with a greater dynamic range than would be exhibited by an element individually. The particular arrangement of quantum circuit elements in series and in parallel may be tuned so that the quantum circuit can exhibit a desired dynamic range when acting as an amplifier, without scarifying gain or bandwidth of the quantum circuit.

According to some embodiments, the quantum circuit elements are non-linear circuit elements, such as Josephson junctions. Circuit elements typically used to produce macroscopic (non-quantum) amplifiers, such as inductors and capacitors, are linear components and therefore their combination in a circuit is generally predictable and straightforward to model. However, quantum elements that may be operated as an amplifier are typically non-linear in nature, and thus combining them in a circuit, whether in series and/or in parallel, is not as straightforward as with macroscopic circuits.

According to some embodiments, the quantum circuit elements in the quantum amplifier are substantially identical to one another. Reducing differences between the elements may improve the performance of the device since each portion of the device will function the same way as other portions. Since the quantum circuit elements are directly coupled to one another, however, this hybridizes them, which guards against variations in device parameters. Thus, while the quantum circuit elements may exhibit slight variations among themselves, the direct coupling in the circuit may guard against performance loss as a result.

Following below are more detailed descriptions of various concepts related to, and embodiments of, techniques for producing quantum amplifiers. It should be appreciated that various aspects described herein may be implemented in any of numerous ways. Examples of specific implementations are provided herein for illustrative purposes only. In addition, the various aspects described in the embodiments below may be used alone or in any combination, and are not limited to the combinations explicitly described herein.

Figure 2:
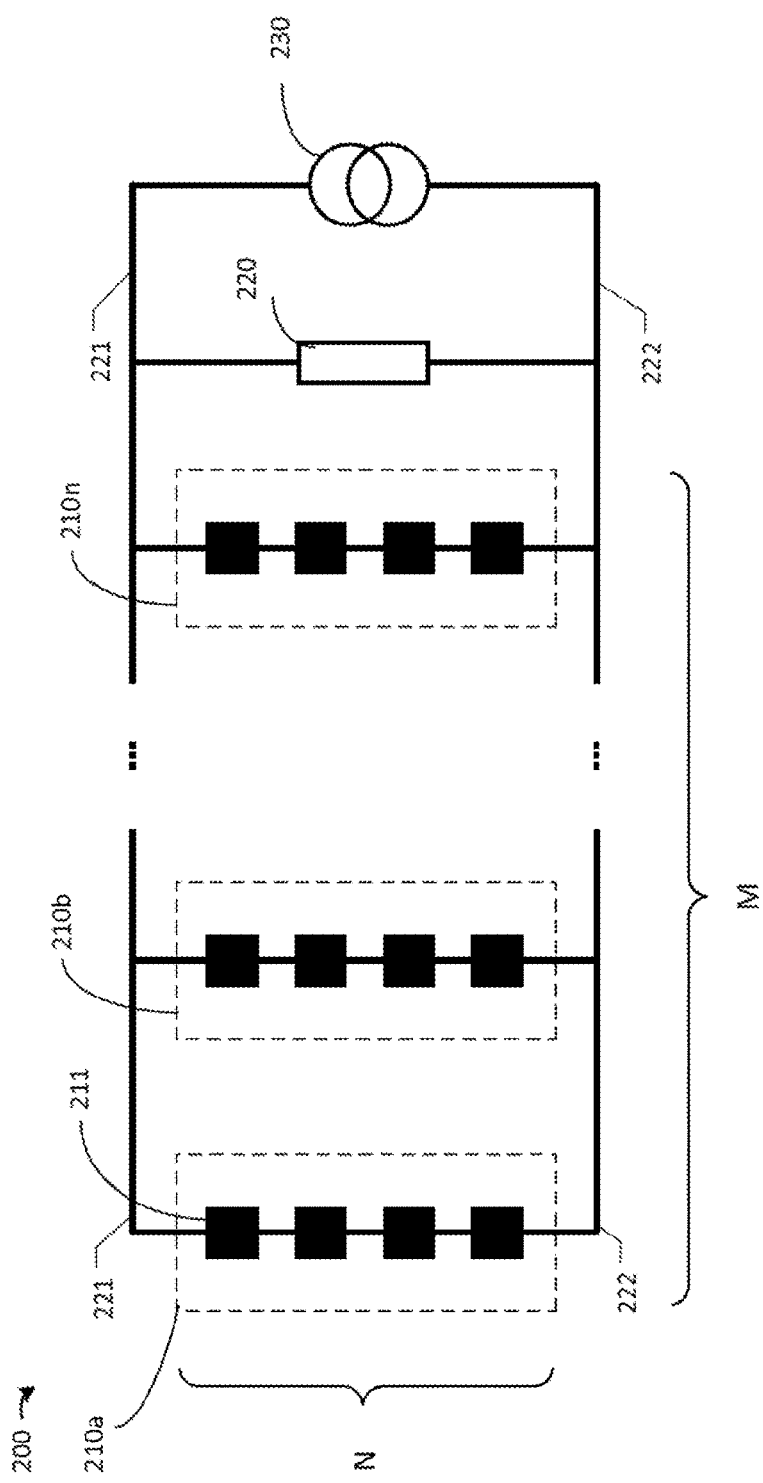
FIG. 2 is a circuit diagram of a quantum amplifier circuit, according to some embodiments.

In the illustrative circuit 200 shown in the circuit diagram of FIG. 2, a sub-circuit 210a includes a plurality of quantum circuit elements 211 coupled together in series. The sub-circuit 201a may include any number of quantum circuit elements 211 coupled in series, such as N quantum circuit elements. As used herein, elements arranged "in series" refers to elements connected such that there is only one path for a signal to flow through each of the elements. For instance, in the example of FIG. 2, there is only one path for a signal to flow between terminal 221 and terminal 222 through all the elements 211 inside sub-circuit 210a. In the non-limiting example in FIG. 2, N=4 is shown. In the example of FIG. 2, the quantum circuit elements (e.g., element 211) serially coupled in the sub-circuit 210a are substantially the same as one another, although in some embodiments each quantum circuit element may be selectively tuned to have different quantum circuit characteristics for improving the performance of a quantum amplifier.

Although not shown, the sub-circuit 210a in FIG. 2 may, in addition to the quantum circuit elements shown, include any number of additional circuit elements that have impedances representing additional capacitances, inductances and/or resistances, which may be arranged in series and/or in parallel with the quantum circuit elements. The additional circuit elements in sub-circuit 210a may, for example, contribute an unintentional parasitic and/or stray impedance inside a sub-circuit and/or between a sub-circuit and elements outside the sub-circuit. In some embodiments, the additional circuit elements may be intentionally introduced with impedances selectively tuned for improving the performance of a quantum amplifier.

The circuit 200 in the example of FIG. 2 includes a source 230, which may include any suitable voltage and/or current source. Circuit 200 further includes a source impedance 220 (e.g., a resistor) connected in parallel to the sub-circuit 201a. As used herein, elements arranged "in parallel" refers to elements that are both connected in-between the same two terminals. For instance, in the example of FIG. 2, the sub-circuit 201a is connected in between the two terminals 221 and 222 of source 230.

The circuit 200 may amplify an input source signal provided by the source 230. For example, in some embodiments the source 230 may be a current source and which may include an input current signal that, when applied to the rest of the circuit 200, is amplified proportionally by the circuit 200. The source 230 may additionally provide any suitable signals to power the operation of elements in sub-circuits such as 210a.

In the example of FIG. 2, a plurality of sub-circuits 210a, 210b, ... 210n are coupled together in parallel. Any number of sub-circuits 210 may be coupled together in parallel, such as M sub-circuits as shown in FIG. 2. In the example of FIG. 2, the sub-circuits are substantially the same with each other, although in general this need not necessarily be the case. Each of the M sub-circuits includes N quantum circuit elements connected in series such that a two dimensional network of N×M quantum circuit elements are hybridized together in the example of FIG. 2. Each sub-circuit is also coupled in parallel with the current source 230 and source impedance 220 in order to amplify the same input signal as well as to receive any suitable power supply signal from source 230. Although a two-dimensional network of N×M substantially identical quantum circuit elements are shown, the inventors have recognized that elements in each serial sub-circuit may be tuned to have different quantum circuit characteristics and that different number of serial elements may be provided in each parallel sub-circuit for improving the performance of a quantum amplifier.

Figure 3:
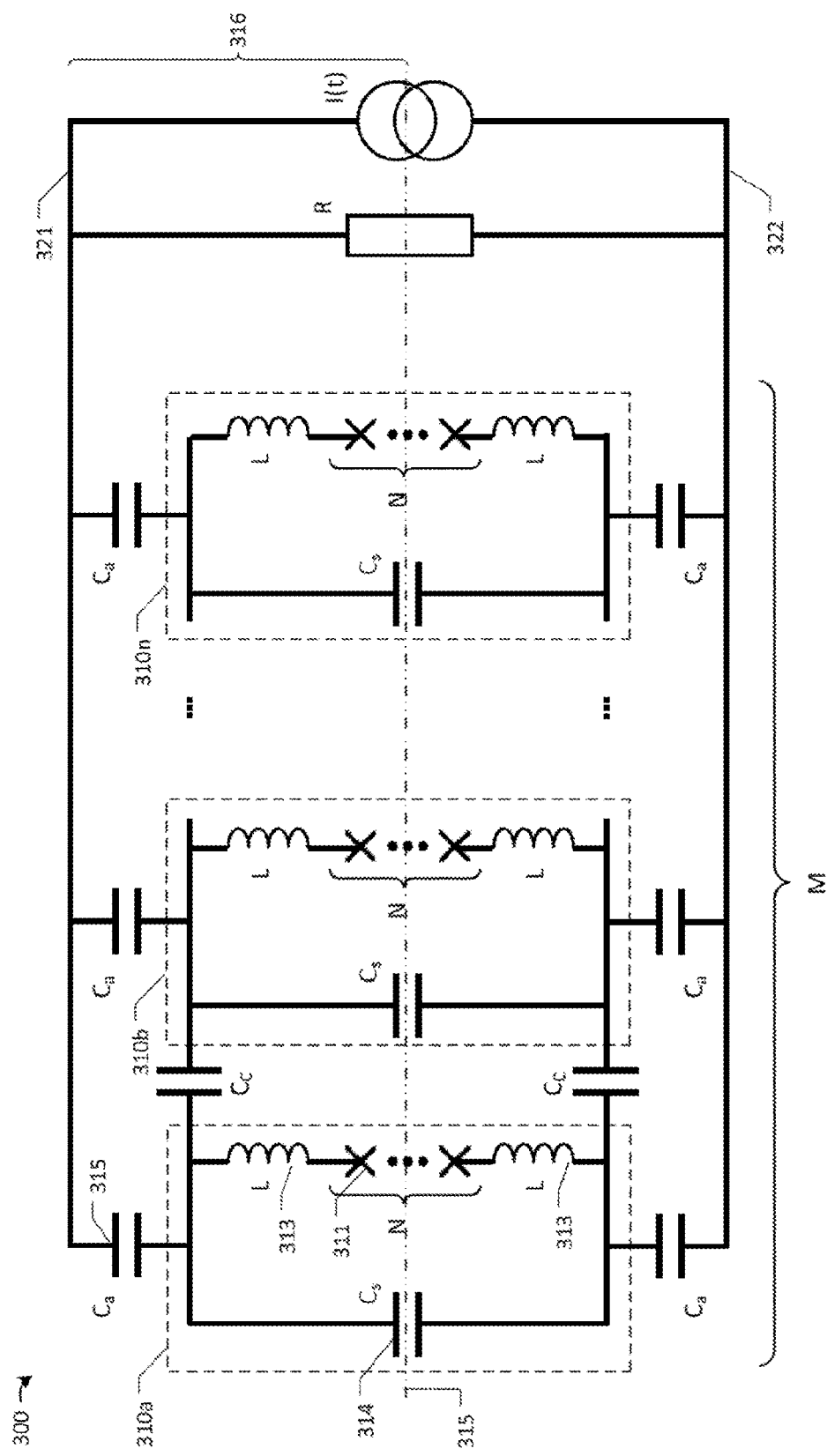
FIG. 3 is a circuit diagram of a quantum amplifier circuit that comprises Josephson junctions, according to some embodiments.

FIG. 3 is a circuit diagram of a quantum amplifier circuit that comprises Josephson junctions, according to some embodiments. Circuit 300 shown in FIG. 3 is an example of circuit 200 shown in FIG. 2 in which the quantum circuit elements are Josephson junctions and in which numerous additional circuit elements comprising capacitors and inductors are also included within the circuit, some of which are included within a sub-circuit of circuit 300.

The circuit diagram in FIG. 3 shows an illustrative example of a sub-circuit 310a within circuit 300. The sub-circuit 310a includes an array of N identical Josephson junctions 311 as quantum circuit elements connected in series. Each Josephson junction has Josephson energy $E_J$ and the gauge-invariant Josephson phase difference across each individual Josephson junction is $\varphi/N$ in a 1st self-resonant mode, where $\varphi$ is the total Josephson phase difference across the entire serial array of Josephson junctions. The array of Josephson junctions 311 collectively provides a current $$I = I_0 \sin\left(\frac{\varphi}{N}\right)$$

(not shown), where $I_0$ is the critical current of each Josephson junction. In some embodiments, the Josephson junctions may be non-dissipative.

In the example of FIG. 3, the sub-circuit 310a includes two inductances L 313 coupled in series to both ends of the array of N Josephson junctions. L may be stray inductance or in some embodiments intentional inductance with a value selected to tune the performance of a quantum amplifier. The sub-circuit 310a in FIG. 3 also includes a shunt capacitance $C_s$ (314) with a value selected to shunt both ends of the serial array including the inductance L, the array of Josephson junctions and a second inductance L, in order to tune the resonance properties of the Josephson junctions in order to improve the performance of a quantum amplifier.

In the example of FIG. 3, two capacitances $C_a$ 315 are used, each on one end of the serial array including the inductance L, the array of Josephson junctions and a second inductance L in the sub-circuit 310a to couple the sub-circuit in parallel to a current source I(t) and a source resistance R. The current source I(t) includes a component based on the input signal to be amplified, as well as pump signal components to parametrically adjust the amplifier gain of the non-linear Josephson junction oscillators in the sub-circuit 210a.

In the example of FIG. 3, M sub-circuits 310a, 310b, ... 310n are coupled together in parallel. Each of the M sub-circuits coupled in parallel includes N Josephson junctions connected in series such that a two dimensional network of N×M Josephson junctions are hybridized together. In the example of FIG. 3, each sub-circuit is coupled in parallel with the current source I(t) and the source resistance R via a capacitance $C_a$ on each side of the sub-circuit in order to amplify the same input signal as well as to receive any suitable pump signal from the source I(t).

In the example of FIG. 3, each sub-circuit is coupled to an adjacent sub-circuit via two capacitances $C_c$. In some embodiments, $C_c$ may be unintentional parasitic capacitance between sub-circuits spatially close to each other. In some cases, whether this is the case may depend on a fabrication method of the sub-circuits. In some embodiments, during an amplification process, $C_c$ may serve to repel other modes from a common mode operating in all Josephson junctions, when all the other modes are repelled to lower frequencies and are thus excluded from the amplification process.

Having described an illustrative circuit diagram of an embodiment of this invention in FIG. 3, FIG. 4 shows a sequence of reduced circuit representations of the circuit diagram in FIG. 3 for ease of analysis to illustrate some embodiments.

FIG. 4A is a reduced circuit representing circuit elements in the top half portion 316 in the circuit diagram in FIG. 3. FIG. 4A includes the same number of M sub-circuits in parallel, each sub-circuit includes N/2 Josephson junctions in series with only one inductance L, a shunt capacitance of value $2C_s$, and only one capacitance $C_a$ further connecting a first end 431 of each sub-circuit to terminal 421 of a current source I(t) and a source resistance R/2. The second end 432 of each sub-circuit is denoted ground and can be compared with a horizontal middle-plane 315 of the circuit in FIG. 3. Due to symmetry of the circuit diagram in FIG. 3 about the middle-plane 315, circuit parameters such as current and voltage for each of the elements in the portion 316 above the middle-plane in the example of FIG. 3 are identical to those in corresponding elements opposite the middle-plane. Therefore, it may be sufficient to analyze circuit parameters in the reduced circuit in FIG. 4A which essentially include elements, or in the case of $C_s$, R and I(t) an equivalent split of elements, from one half of the circuit in FIG. 3, in order to analyze performance characteristics of the full circuit in FIG. 3. Analyzing the reduced circuit in FIG. 4A that include (N/2)×M Josephson junctions may reduce the complexity of the circuit analysis.

The M parallel sub-circuits in the reduced circuit representation in FIG. 4A can be further reduced. Because each one of the M parallel sub-circuits in the example of FIG. 4A is substantially the same as each other, the solutions for circuit parameters within each sub-circuit may be substantially identical as well, or in other words, each sub-circuit is in a common mode with the rest of the sub-circuits. An analysis of only one representative sub-circuit may present sufficient information to solve the entire circuit in FIG. 4A or FIG. 3. In the example of FIG. 4B, a reduced sub-circuit including only N/2 serially connected Josephson junctions, an inductance L, a shunt capacitance $2C_s$ and a connecting capacitance $C_a$ is shown connected to an equivalent split of source impedance MR/2. The source impedance is split such that when M of them are combined in parallel, the R/2 equivalent resistance in FIG. 4A will be reproduced.

FIG. 4C shows another example reduced circuit representing the single sub-circuit in FIG. 4B, by transforming impedances $C_a$, $2C_s$ and MR/2 into equivalent impedances C' and R'. The reduced circuit in FIG. 4C contains less number of elements and is simpler for analysis than the original circuit in the illustrative example in FIG. 3. Only (N/2) serially coupled Josephson junctions in series with impedances L, C' and R' are present in FIG. 4C. Although not shown, the values for C' and R' depend on the measure of the parallelism M of the M parallel sub-circuits arranged in the original circuit in FIG. 3. To aid analysis of the circuit of FIG. 3 via the reduced representation of FIG. 4C, in some cases an input current source may be included in the circuit in FIG. 4C. By performing a non-linear quantum circuit analysis in the reduced single sub-circuit in FIG. 4C and combining the results M-times one can determine the compete quantum amplifier circuit response from N serial and M parallel Josephson junction arrays as shown in the embodiment in FIG. 3.

In some embodiments, determining a circuit Hamiltonian for a non-linear quantum circuit may allow quantification of how the quantum circuit can perform as an amplifier and how key amplifier properties may depend on the non-linearity of the quantum circuit as indicated by the circuit Hamiltonian. The non-linear effective circuit Hamiltonian for the reduced quantum circuit model shown in FIG. 4C can be derived using circuit analysis in combination with quantum mechanics as:

$$\mathcal{H} = \hbar\omega a^\dagger a - \beta(a+a^\dagger)^4 \quad \text{(Eqn. 1)}$$

where the non-linearity factor $$\beta = \frac{(\hbar\omega)^2}{24N^2\phi_0^2} \frac{\mathbb{L}_J p^2}{M} \quad \text{(Eqn. 2)}$$

In Eqn. 1, $\hbar$ is the reduced Planck constant; $\omega$ is the frequency of the oscillatory mode of the circuit shown in FIG. 4C; $a^\dagger$, $a$ are creation and annihilation operators, respectively. In Eqn. 2, N and M are the number of serial Josephson junctions and parallel sub-circuits of Josephson junctions in the N×M network of Josephson junctions in the example of FIG. 3, $\phi_0$ is the magnetic flux quantum, and $\mathbb{L}_J = L_J(N/2)$ is the total Josephson junction inductance of the serially coupled N/2 Josephson junctions in the reduced circuit diagram in FIG. 4C, where each Josephson junction has a Josephson junction inductance of $L_J = \phi_0^2/E_J$ and $E_J$ is each junction's Josephson energy that can be tuned depending on the construction of each Josephson junction. p is a participation ratio of the inductance from the N/2 serially coupled Josephson junctions in the example circuit diagram in FIG. 4C, to the total inductance in the same circuit and is defined by:

$$p = \frac{\mathbb{L}_J}{L + \mathbb{L}_J} \quad \text{(Eqn. 3)}$$

where L is the inductance shown in FIG. 4C.

The oscillator frequency of the reduced circuit in FIG. 4C is:

$$\omega = \sqrt{\frac{p}{\mathbb{L}_J C'}} \quad \text{(Eqn. 4)}$$

based on the circuit Hamiltonian, where C' is the equivalent capacitance in the example of FIG. 4C.

The quality factor Q of the oscillator based on the circuit Hamiltonian is:

$$Q = 1/(\omega R'C') \quad \text{(Eqn. 5)}$$

where R' is the effective resistance in the example of FIG. 4C. Both $\omega$ and Q are functions of C' and/or R' according to Eqns. 4 and 5. Since both C' and R' as shown in FIG. 4C are effective impedances transformed from the circuit containing two independent variables $C_a$ and $2C_s$ as shown in FIG. 4B, adjusting each of the values of $C_a$ and $2C_s$ during construction of a quantum circuit such as the quantum amplifier circuit in the example of FIG. 3 may allow independent tuning of $\omega$ and Q of the quantum amplifier to any suitable values for improving the performance of a quantum amplifier.

As described above, an amplifier's dynamic range is the difference between the largest and smallest input signals that can be effectively amplified, and it may be beneficial for a quantum amplifier to have a high dynamic range relative to its gain and bandwidth. In some embodiments, the power of input signals to a quantum amplifier may be represented by the number of photons $n_p$ in the signal input source, for instance in the pump signals in the current source I(t) in the example of FIG. 3.

Figure 5:
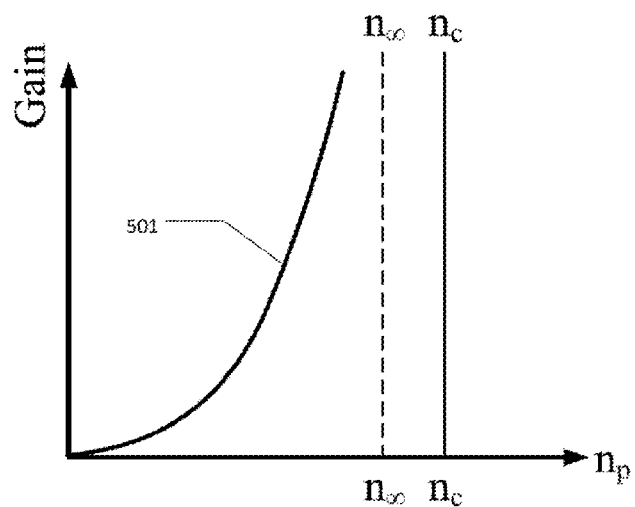
FIG. 5 is a graph illustrating the gain of a quantum amplifier, according to some embodiments.

In some embodiments, gain from a non-linear parametric amplifier may depend on the power of the input signals. The curve 501 in FIG. 5 shows gain as a function of input power $n_p$ in an illustrative non-linear Josephson junction quantum amplifier. As shown in FIG. 5, the non-linear quantum amplifier gain increases superlinearly with increasing $n_p$ until $n_p$ approaches an infinite gain point $n_\infty$, after which the gain-$n_p$ relation ceases to apply. The infinite gain point for number of photons $n_\infty$ represents the highest amount of input signal power that can be effectively amplified by a quantum amplifier in the example of FIG. 5 with a certain gain. Therefore, the input signal powers from 0 to $n_\infty$ represent the dynamic range of the quantum amplifier and $n_\infty$ may be used as the figure of merit to denote the dynamic range. Generally speaking, therefore, it may be desirable for a quantum amplifier to have a large $n_\infty$ in order to have a large dynamic range, although as discussed below there may be a value of $n_\infty$ ($n_c$ discussed below) above which certain detrimental effects may outweigh the benefits.

In some embodiments, the value of $n_\infty$ may be defined when the shift in oscillator resonance frequency $\omega$ equals a line width. For non-linear quantum amplifiers with circuit Hamiltonian in the form of Eqn. 1, $n_\infty$ occurs when the following is satisfied:

$$1 - \frac{\partial_n E_{n|n_\infty}}{\hbar\omega} = \frac{1}{4Q} \quad \text{(Eqn. 6)}$$

where $E_n$ is the resonance energy for a single harmonic oscillator eigenstate being pumped with photon number n as input signal energy, while $\hbar\omega_0$ is the energy of the fundamental mode of the oscillator.

Solving Eqn. 6 using the circuit Hamiltonian in Eqn. 1 yields:

$$n_\infty = \frac{MN^2\phi_0^2}{Q\hbar\omega \mathbb{L}_J p^2} - \frac{1}{2} \quad \text{(Eqn. 7)}$$

Therefore, according to Eqn. 7 the serial junction number N and the measure of parallelism M, along with other circuit parameters such as L, $C_a$ and $2C_s$ may be chosen to tune the value of $n_\infty$ for improving the dynamic range of a quantum amplifier. As discussed above, while the ultimate goal is to select suitable values of L, $C_a$, $C_c$ and $C_s$ for the circuit 300 of FIG. 3, the reduced representations shown in FIGS. 4A-4C are helpful to allow a simplified analysis, as described herein.

In some embodiments, there may be a particular input power value denoted by a photon number $n_c$, beyond which the non-linear quantum amplifier may enter a bistable state and become unsuitable for effective amplification. In the example of FIG. 5, signals with input power $n_p$ larger than $n_c$ would no longer be stably amplified. When $n_\infty < n_c$, dynamic range equals $n_\infty$; when $n_\infty > n_c$, dynamic range is limited to $n_c$. Therefore, tuning a circuit as described herein may comprise both maximizing the dynamic range represented by $n_\infty$ whilst also ensuring that $n_\infty$ does not rise above $n_c$.

In the example circuit in FIG. 4C, $n_c$ is reached when the average value of Josephson phase change across each one of the N/2 serial junction array $$\left\langle \frac{2\Phi}{N\phi_0} \right\rangle = \pi/2,$$

where $\Phi$ is the total magnetic flux across the entire serial array of Josephson junctions. Solving the reduced circuit diagram in FIG. 4C yields:

$$n_c = \frac{(N\pi\phi_0)^2 M}{32\hbar\omega \mathbb{L}_J p} \quad \text{(Eqn. 8)}$$

Therefore, according to Eqn. 8 the serial junction number N and the measure of parallelism M, along with other circuit parameters such as L, $C_a$ and $2C_s$ may be chosen to tune the value of $n_c$. In some embodiments, in order to improve the dynamic range of a quantum amplifier, circuit parameters N, M, L, $C_a$, $C_c$ and/or $C_s$ may be collectively tuned so that the value of $n_\infty$ is maximized without exceeding the value of $n_c$.

Figure 6:
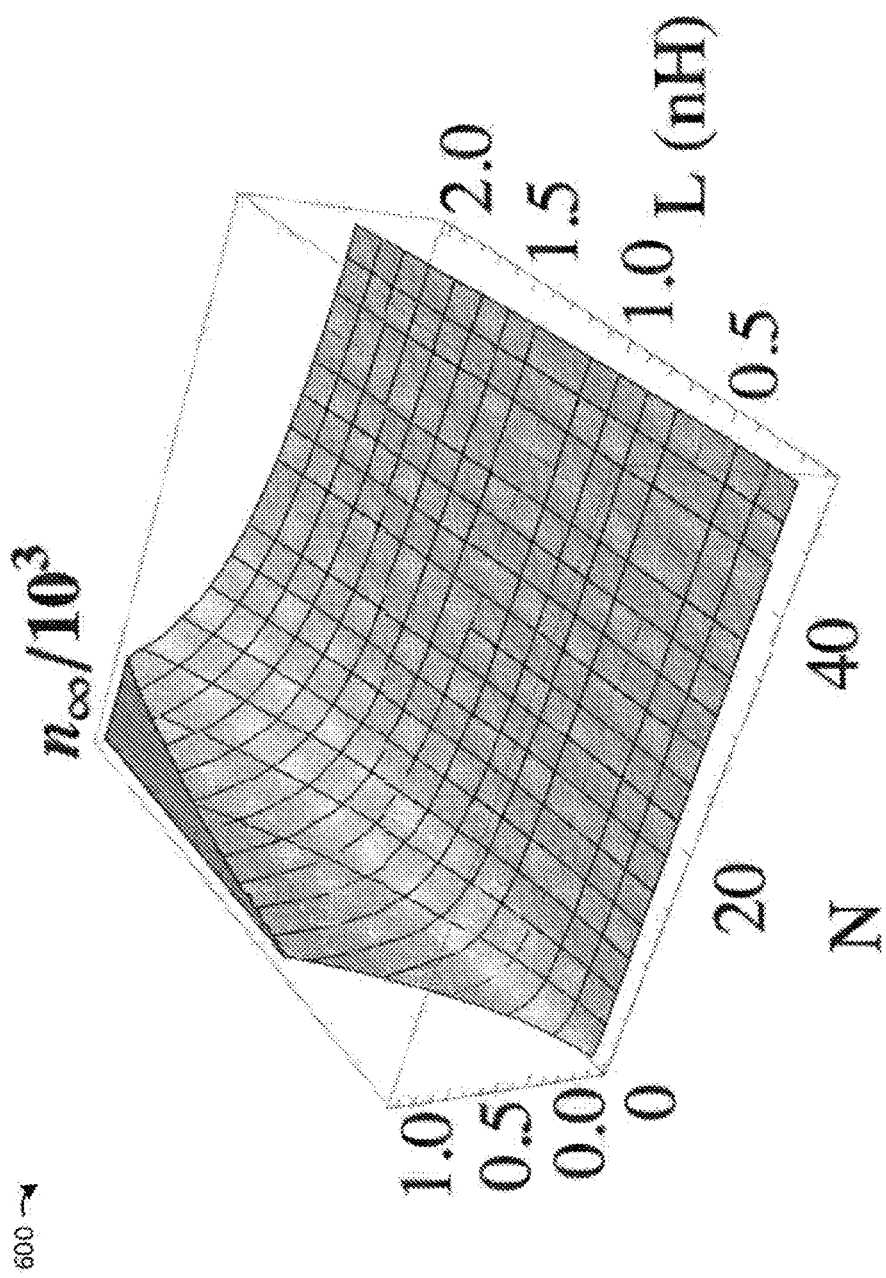
FIG. 6 is a three-dimensional contour plot illustrating how the gain of a quantum amplifier changes based on an inductance and based on the number of quantum amplifier elements coupled together in series, according to some embodiments.

FIG. 6 illustrates a calculated three-dimensional contour plot for $n_\infty$ as a function of both circuit inductance L as shown in the example circuit diagram in FIG. 4C and the serial junction number N, for an embodiment where M=1 and the critical current for each Josephson junction $I_0$=5 μA. For each given array of N serial Josephson junctions, increasing L leads to an increase of $n_\infty$ as a result of Eqns. 3 and 7. On the other hand, with the inductance L fixed, $n_\infty$ and thus the dynamic range increases as N increases for L close to zero. For other values of L, however, $n_\infty$ first decreases when N increases from 1 before increasing gradually with increasing N in the example of FIG. 6. Such as result illustrates the difference between serial coupling of conventional, linear amplifiers and serial coupling of non-linear quantum amplifiers such as individual Josephson junctions. In a conventional circuit with a total load voltage V applied on N serially coupled identical linear amplifiers, each linear amplifier receives a reduced load portion V/N. If each individual linear amplifier has dynamic range from 0 to $V_t$, the dynamic range for N serially coupled linear amplifiers would be $NV_t$ and would increase with the addition of higher number of N. On the other hand, in an array of N serially coupled non-linear Josephson junction amplifier array, even though the Josephson phase difference across each individual Josephson junction is $\varphi/N$, a portion of the total phase difference $\varphi$, the dynamic range of the array may increase or decrease with N as the foregoing analysis in the example of FIG. 6 illustrates, due to interplay between quantum Josephson junction inductances $\mathbb{L}_J$ and circuit inductance L (as represented by the inductive participation ratio p in Eqn. 7), which does not apply in classical linear circuits.

Figure 7A:
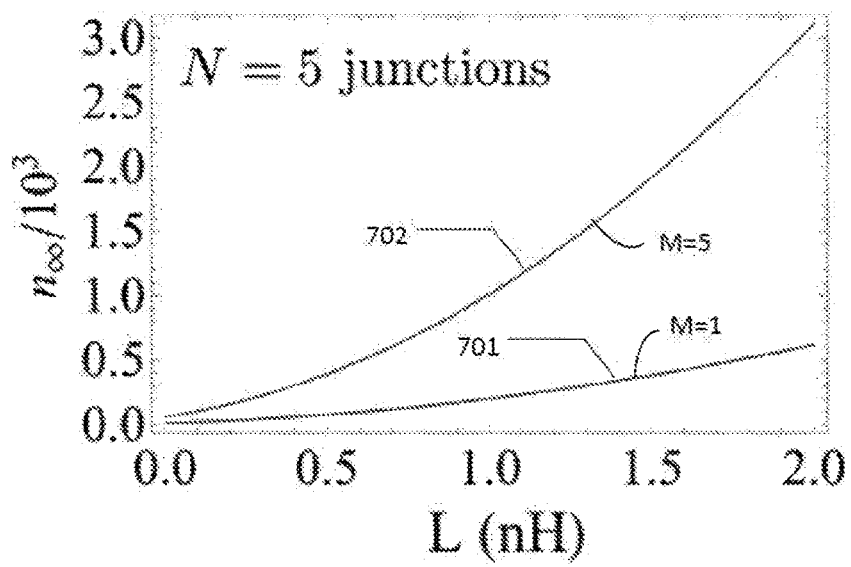
FIG. 7A is a graph of an infinite gain point of a quantum amplifier versus an inductance of the amplifier for two different measures of the parallelism of the circuit, according to some embodiments.

The M=1 curve 701 in FIG. 7A corresponds to a cross-sectional view of the contour plot in FIG. 6. In this example, N is fixed at 5 serial junctions. A suitable value for inductance L may be selected based on the $n_\infty$ versus L relationship illustrated in FIG. 7A. In some embodiments, multiple sub-circuits of serially connected Josephson junctions may be coupled in parallel to provide a higher range of values of $n_\infty$. In the example of FIG. 7A, the M=5 curve 702 shows that by increasing the measure of parallelism M to 5 and coupling 5 arrays in parallel, forming a 5×5 network of Josephson junction amplifiers, the dynamic range or $n_\infty$ may be tunable to up to $3.1 \times 10^3$ for inductance of L=2.0 nH, higher than the $n_\infty$=0.6 at L=2.0 nH achieved when only 1 serial array of Josephson junction is used. Therefore tuning the value of M and/or N may lead to an improved dynamic range without $n_\infty$ exceeding the value $n_c$.

Figure 7B:
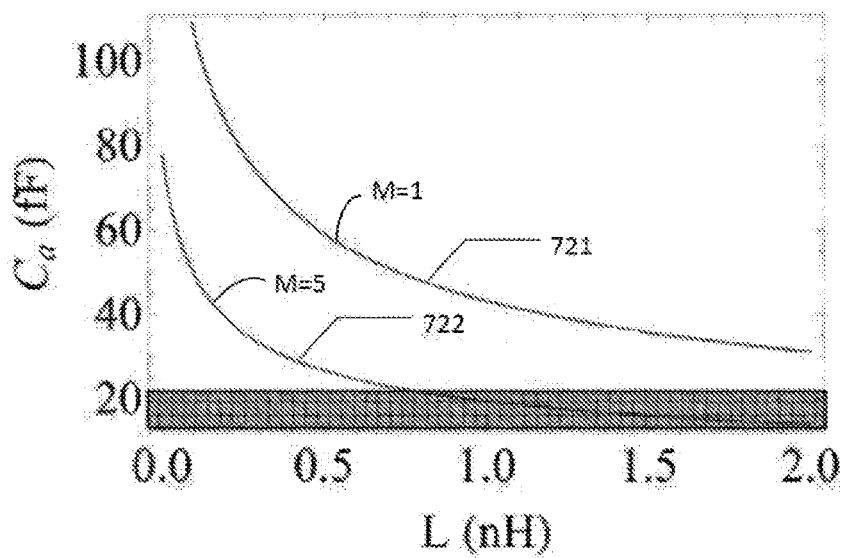
FIG. 7B is a graph of a first capacitance of a quantum amplifier versus an inductance of the amplifier for two different measures of the parallelism of the circuit, according to some embodiments.

In the example of FIG. 7B, the oscillator fundamental frequency is chosen at $$\frac{\omega_0}{2\pi} = 10 \text{ GHz}$$

with quality factor Q=100, which sets specific constraints on values of C' and R' as defined in Eqns. 4 and 5 for the example circuit diagram in FIG. 4C and therefore sets specific constraints on choice of values for capacitances $C_a$ and $2C_s$ as shown in FIG. 4B. The M=1 curve 721 in the example of FIG. 7B shows the relation between choices of $C_a$ and L, for an array of Josephson junction amplifiers with 5 junctions in series and 1 such serial junctions in parallel. The M=5 curve 722 in the example of FIG. 7B shows that expanding the measure of parallelism to include M=5 parallel arrays would lead to a smaller value for $C_a$ for a given L. Therefore in some embodiments, a smaller capacitor $C_a$ value may be chosen when additional parallel sub-circuits are constructed. The inventors have recognized that small capacitors with capacitance values smaller for example 20 fF as shown in the shaded area in the example of FIG. 7B may be more difficult to fabricate in a device that includes quantum circuit elements. Although any suitable semiconductor manufacturing techniques may be used to fabricate structures with capacitance values tuned for improving the performance of quantum amplifiers.

Figure 7C:
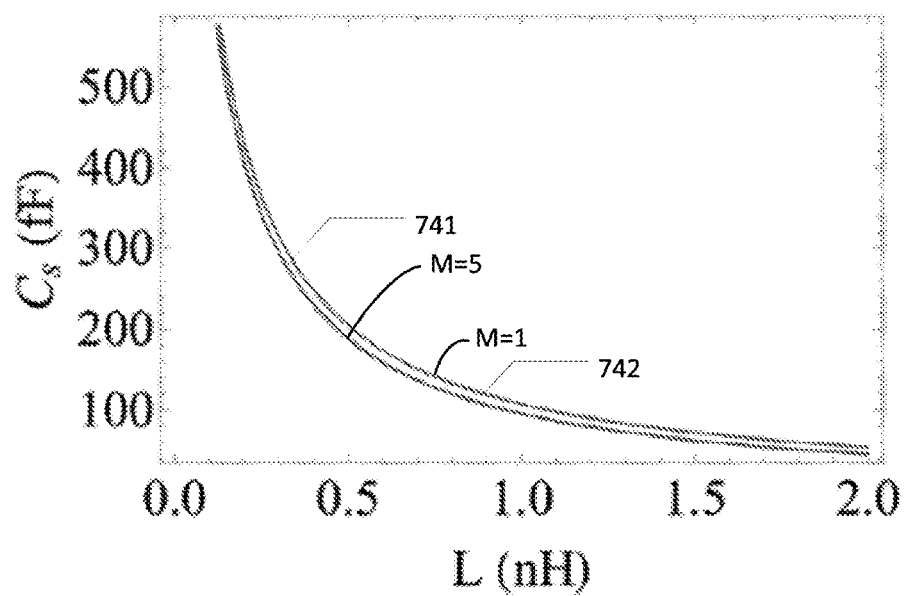
FIG. 7C is a graph of shunt capacitance of a quantum amplifier versus an inductance of the amplifier for two different measures of the parallelism of the circuit, according to some embodiments.

Similar to the example of FIG. 7B, the example of FIG. 7C illustrates the relation between values of shunt capacitance $C_s$ and inductance L for an oscillator with fundamental frequency $$\frac{\omega_0}{2\pi} = 10 \text{ GHz}$$

and quality factor Q=100. The M=1 curve 741 and M=5 curve 742 in the example of FIG. 7C show that the choice of $C_s$ for a given L is not as sensitive to the number of parallel junctions M as $C_a$ as shown in the example of FIG. 7B. Since smaller $C_s$ may be used when L becomes larger according to FIG. 7C, in some embodiments the use of shunt capacitors comprising silicon nitride may be eliminated by using an array of Josephson junctions with additional inductance.

Although not shown, adding an intrinsic junction capacitance $C_J$ for each Josephson junction in the circuit diagram in FIG. 4C yields a very small variation to the calculated results in FIG. 7C. Therefore including intrinsic array capacitances $C_J$ only affects the choice of shunt capacitance $C_s$ by very little.

Figure 8:
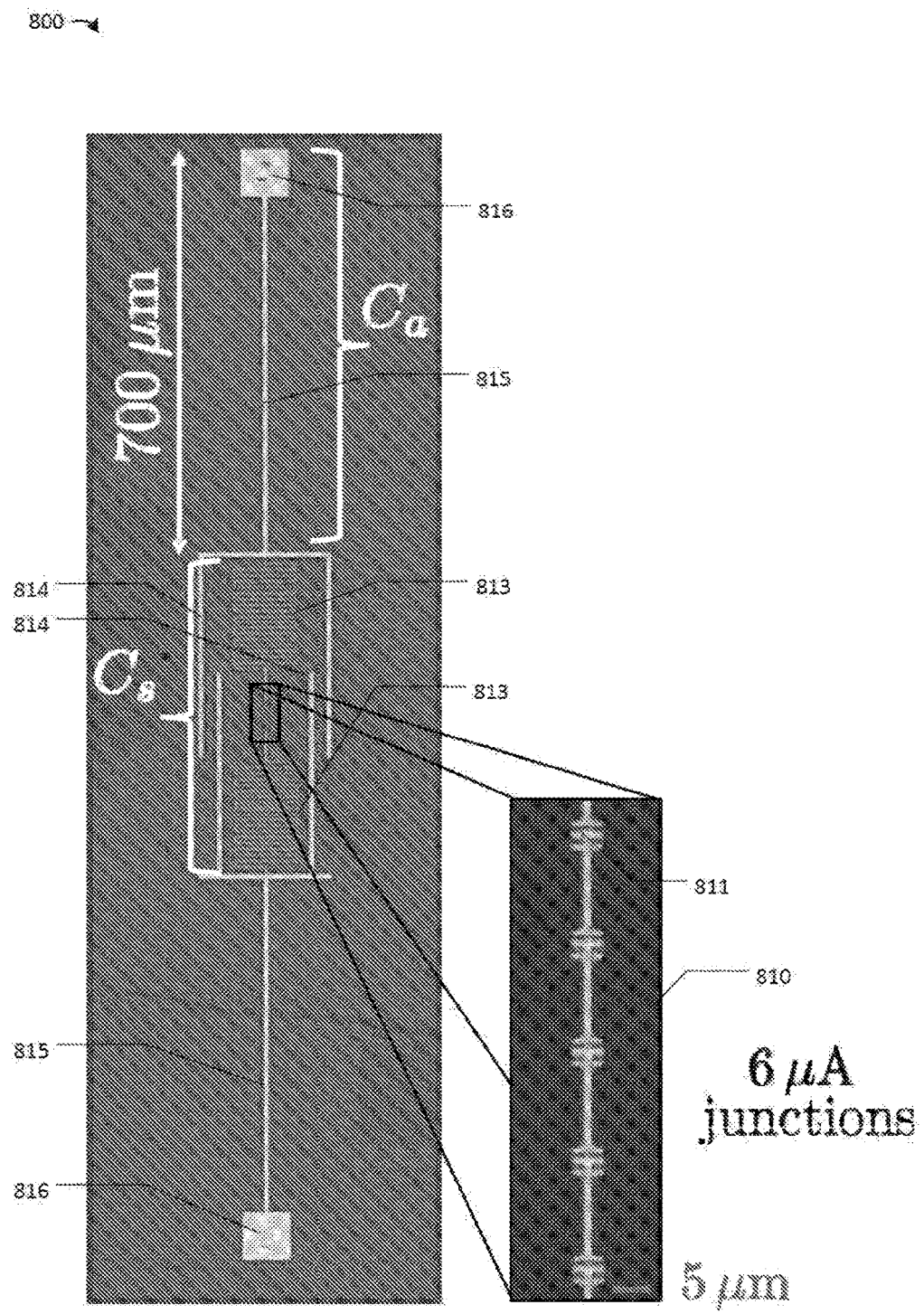
FIG. 8 is a top view image of a portion of an illustrative quantum amplifier, according to some embodiments.

FIG. 8 shows a top view of an illustrative array of non-linear Josephson junction amplifiers 800 with N=5, M=1. According to the example of FIG. 8, each of the 5 Josephson junctions 811 in the serial Josephson junction array 810 may have a critical current $I_0$=6 µA. The serial Josephson junction amplifiers 800 in FIG. 8 further include two meandering wire inductors 813 disposed above and below as inductance L. Shunt capacitors $C_s$ 814 are placed in parallel to the serial array and inductors. Two shunt capacitors $C_a$ 815 connect the serial junction array 810 and inductors 813 to two contact pads 816 disposed at the both ends of the circuit 800 in FIG. 8. Although a length of 700 µm is shown for the capacitor $C_a$, any suitable dimension may be used for constructing capacitances $C_a$ and $C_s$.

Figure 9:
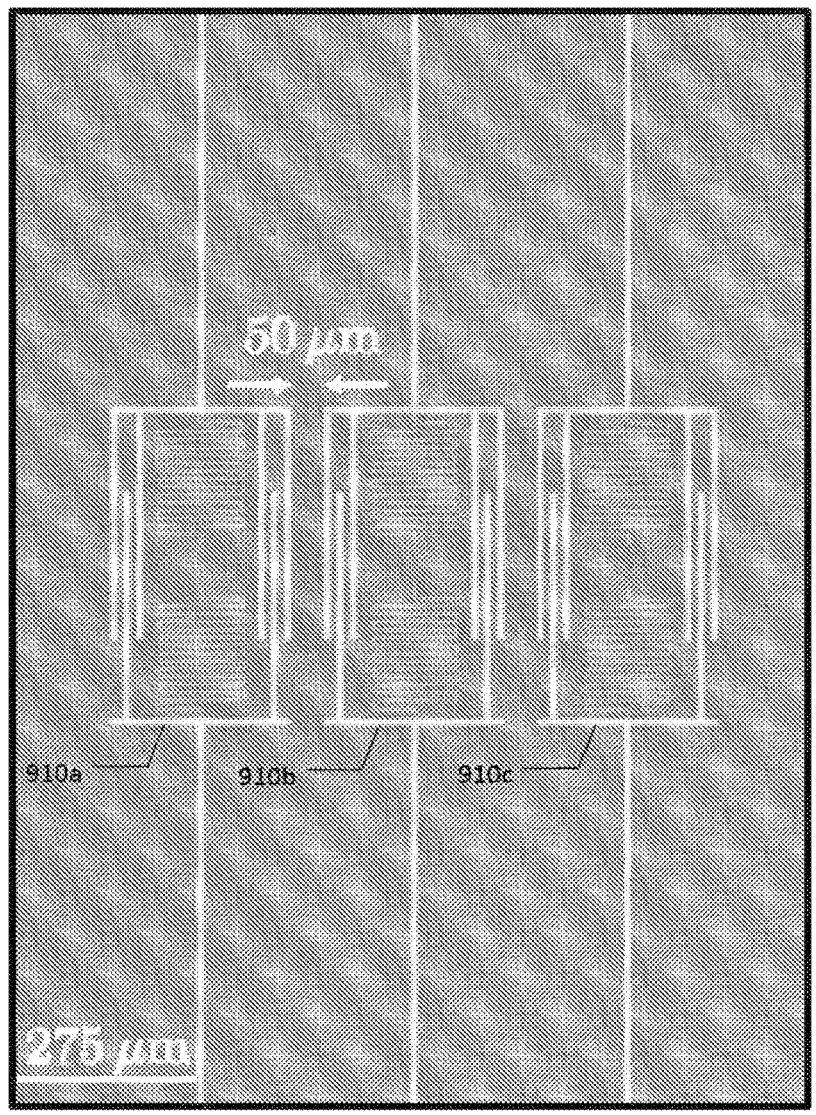
FIG. 9 is a top view image of a portion of an illustrative quantum amplifier depicting multiple sub-circuits connected together in parallel, according to some embodiments.

FIG. 9 shows a top view of an illustrative array of non-linear Josephson junction amplifiers 900 with M=3. According to the example of FIG. 9, adjacent sub-circuits such as 910a and 910b are spaced at a fixed distance from each other. Although 50 µm is used, any suitable spacing may be used for constructing a coupling capacitance $C_c$ for rejection of modes other than a common mode.

Having thus described several aspects of at least one embodiment of this invention, it is to be appreciated that various alterations, modifications, and improvements will readily occur to those skilled in the art.

Such alterations, modifications, and improvements are intended to be part of this disclosure, and are intended to be within the spirit and scope of the invention. Further, though advantages of the present invention are indicated, it should be appreciated that not every embodiment of the technology described herein will include every described advantage. Some embodiments may not implement any features described as advantageous herein and in some instances one or more of the described features may be implemented to achieve further embodiments. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A quantum circuit, comprising:
a plurality of Josephson junctions coupled together in series and in parallel, such that at least two of the Josephson junctions are coupled together in series and at least two of the Josephson junctions are coupled together in parallel,
wherein the quantum circuit is configured to receive a plurality of pump signal components, each pump signal component parametrically adjusting a Josephson junction gain in such a manner that the quantum circuit acts as an amplifier.

2. The quantum circuit of claim 1, wherein N of the Josephson junctions are coupled together in series within a sub-circuit of the quantum circuit, and wherein a plurality of said sub-circuits are coupled together in parallel M times within the quantum circuit.

3. The quantum circuit of claim 2, wherein N is at least 3 and M is at least 3.

4. The quantum circuit of claim 2, further comprising a first capacitor within each of the plurality of sub-circuits.

5. The quantum circuit of claim 2, further comprising at least one inductor within each of the plurality of sub-circuits.

6. The quantum circuit of claim 2, further comprising a plurality of second capacitors each coupled between neighboring pairs of the sub-circuits.

7. The quantum circuit of claim 1, wherein the quantum circuit is configured to operate the plurality of circuit elements in a hybrid common mode.

8. The quantum circuit of claim 1, wherein the quantum circuit is configured to receive an input signal component and to amplify said input signal component.

9. The quantum circuit of claim 8, wherein the quantum circuit is configured to receive a current source, and wherein the input signal component and the plurality of pump signal components are components of the current source.

10. A quantum circuit, comprising:
a network of a plurality of sub-circuits coupled in parallel, wherein each sub-circuit includes a plurality of non-linear circuit elements coupled in series,
wherein the network is configured to receive an input, across the plurality of sub-circuits, the input comprising a signal to be amplified and a plurality of pump signal components, each pump signal component parametrically adjusting a non-linear circuit element gain in such a manner that the network acts as an amplifier.

11. The quantum circuit of claim 10, wherein the non-linear circuit elements are Josephson junctions.

12. The quantum circuit of claim 10, wherein the plurality of non-linear circuit elements are substantially identical to one another.

13. The quantum circuit of claim 10, wherein N of the non-linear circuit elements are coupled in series within each sub-circuit of the quantum circuit, wherein the network comprises M sub-circuits coupled in parallel, and wherein N is at least 3 and M is at least 3.

14. The quantum circuit of claim 10, further comprising a first capacitor within each of the plurality of sub-circuits.

15. The quantum circuit of claim 10, further comprising at least one inductor within each of the plurality of sub-circuits.

16. The quantum circuit of claim 15, wherein the at least one inductor includes one or more inductors distinct from the one or more circuit elements.

17. The quantum circuit of claim 10, further comprising a plurality of second capacitors each coupled between neighboring pairs of the sub-circuits.

* * * * *